United States Patent
Wu et al.

(10) Patent No.: US 10,020,401 B2
(45) Date of Patent: Jul. 10, 2018

(54) METHODS FOR STRAINING A TRANSISTOR GATE THROUGH INTERLAYER DIELECTRIC (ILD) DOPING SCHEMES

(71) Applicant: TAIWAN SEMICONDUCTOR MANUFACTURING COMPANY, LTD., Hsinchu (TW)

(72) Inventors: Cheng-Ta Wu, Chiayi County (TW); Chii-Ming Wu, Taipei (TW); Shiu-Ko Jangjian, Tainan (TW); Kun-Tzu Lin, Tainan (TW); Lan-Fang Chang, Yunlin County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/399,241

(22) Filed: Jan. 5, 2017

(65) Prior Publication Data
US 2018/0151740 A1 May 31, 2018

Related U.S. Application Data

(60) Provisional application No. 62/427,556, filed on Nov. 29, 2016.

(51) Int. Cl.
*H01L 21/28* (2006.01)
*H01L 21/3115* (2006.01)
(Continued)

(52) U.S. Cl.
CPC .... *H01L 29/7856* (2013.01); *H01L 21/28158* (2013.01); *H01L 21/3115* (2013.01);
(Continued)

(58) Field of Classification Search
CPC ............ H01L 29/7856; H01L 29/7842; H01L 29/401; H01L 29/41; H01L 29/42364; H01L 29/511; H01L 29/512; H01L 29/513; H01L 29/42392; H01L 29/42312–29/42396; H01L 29/49–29/518; H01L 29/66545; H01L 29/66606; H01L 29/6681; H01L 29/66553; H01L 29/6656; H01L 29/66689; H01L 29/66719; H01L 29/0649; H01L 29/1054; H01L 21/28158; H01L 21/28114; H01L 21/28035–21/28105; H01L 21/28185;
(Continued)

(56) References Cited

U.S. PATENT DOCUMENTS 9,577,102 B1 * 2/2017 Hsiao .................. H01L 29/7851
2007/0105297 A1 * 5/2007 Jeong ................ H01L 21/76801
438/197

(Continued)

*Primary Examiner* — Marc Armand
*Assistant Examiner* — Younes Boulghassoul
(74) *Attorney, Agent, or Firm* — Hauptman Ham, LLP (57) ABSTRACT

A method of making a semiconductor device includes doping a first portion of an interlayer dielectric (ILD) with an oxygen-containing material, wherein the ILD is over a substrate. The method further includes doping a second portion of the ILD with a large species material. The second portion includes an area of the ILD below the first portion, and the second portion is separated from the substrate. The method further includes annealing the ILD.

20 Claims, 7 Drawing Sheets

(51) Int. Cl.
*H01L 21/8234* (2006.01)
*H01L 29/51* (2006.01)
*H01L 29/78* (2006.01)
*H01L 29/423* (2006.01)
*H01L 29/40* (2006.01)
*H01L 29/49* (2006.01)
*H01L 29/41* (2006.01)

(52) U.S. Cl.
CPC ...... *H01L 29/401* (2013.01); *H01L 29/42364* (2013.01); *H01L 29/495* (2013.01); *H01L 29/512* (2013.01)

(58) Field of Classification Search
CPC ........... H01L 21/3115; H01L 21/31155; H01L 21/3215; H01L 21/823456; H01L 21/82385; H01L 21/3105; H01L 21/02694; H01L 21/823821; H01L 21/823431; H01L 21/66795; H01L 21/66818; H01L 21/28132; H01L 21/28141; H01L 21/2815; H01L 21/823468; H01L 21/823864
USPC ................................................. 257/410, 411
See application file for complete search history.

(56) References Cited

U.S. PATENT DOCUMENTS

| | | | |
|---|---|---|---|
| 2015/0145066 A1* | 5/2015 | Lu | H01L 29/66795 257/401 |
| 2015/0187939 A1* | 7/2015 | Wu | H01L 29/66545 257/412 |
| 2016/0079034 A1* | 3/2016 | Yieh | H01L 21/26506 427/526 |
| 2017/0110577 A1* | 4/2017 | Wang | H01L 21/265 |
| 2017/0117278 A1* | 4/2017 | Fukutome | H01L 27/0886 |

* cited by examiner

METHODS FOR STRAINING A TRANSISTOR GATE THROUGH INTERLAYER DIELECTRIC (ILD) DOPING SCHEMES

BACKGROUND

Semiconductor devices experience larger amounts of leakage current as channel length decreases. Leakage current adds to operational costs of semiconductor devices and adversely affects battery lifetime and power consumption. Decreasing feature size in integrated circuits increases the probability of manufacturing defects such as voids or seams when depositing films onto surfaces or when filling trenches or other features.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Implanting dopants into an interlayer dielectric (ILD) adjacent to a gate electrode induces strain in the gate electrode. During operation of a semiconductor device having a strained ILD, strain is transferred from the ILD to the gate electrode and a leakage current of the semiconductor device having the doped ILD is lower than in a semiconductor device without a strained ILD. Implanting dopants into the ILD modifies the ILD so that the ILD is more resistant to etching by acids such as hydrofluoric acid (HF). Implanting dopants into the ILD also modifies a sidewall angle of an upper portion of a trench sidewall after sacrificial materials are removed during a gate replacement process. When an upper portion of a trench sidewall is adjusted to have a positive sidewall angle (tilting away from a center of the trench), manufacturing processes that deposit layers of material to form a gate electrode stack have a lower frequency of filling or deposition defects such as voids or "pinch-off" at a trench opening.

Figure 1:
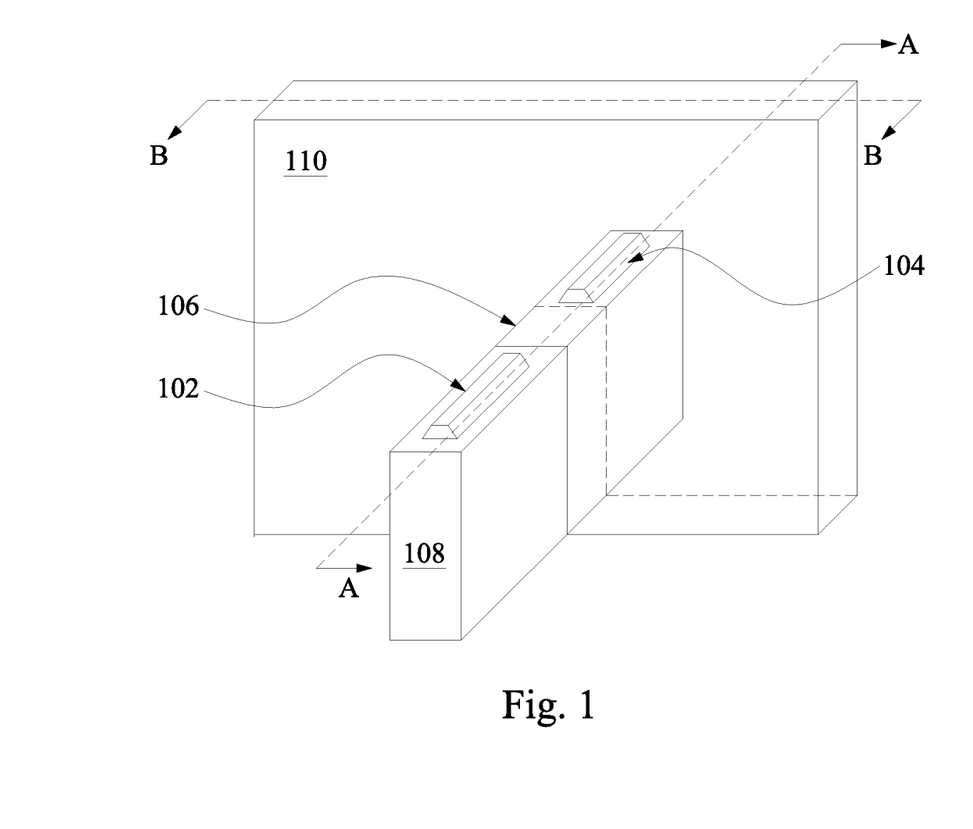
FIG. 1 is a perspective view of an embodiment of a semiconductor device.

FIG. 1 is a perspective view of an embodiment of a semiconductor device 100. A source 102, a drain 104, and a channel 106 are located in a fin 108 of a fin field effect transistor (FinFET). Gate stack 110 lies over channel 106 in fin 108. Cross-sectional line A-A extends along fin 108 through source 102 and drain 104 and indicates a location of a plane through fin 108, gate stack 110, and an interlayer dielectric (ILD) (not shown) on a top side of fin 108. Cross-sectional line B-B extends perpendicular to cross-sectional line A-A through gate stack 110.

In some embodiments, fin 108 is a silicon fin. In some embodiments, fin 108 is made of silicon germanium or of some other semiconductor material. In some embodiments, source 102 and drain 104 are doped regions made of a same material as fin 108. In some embodiments, source 102 and drain 104 are epitaxially grown materials embedded into recesses in fin 108. In some embodiments, epitaxially grown materials (stressing materials) include silicon germanium or other semiconductor materials with a lattice constant that is different from fin material of fin 108. In some embodiments, a lattice constant of the stressing materials is larger than the lattice constant of the fin material and the source and drain apply compressive strain (or compressive stress) on the channel. In some embodiments, a lattice constant of the stressing materials is smaller than the lattice constant of the fin material, applying tensile strain (or tensile stress) on the channel in the fin material. In some embodiments, the strain applied to a channel impact the electrical properties of semiconductor device 100. In some embodiments, semiconductor device 100 is a P-channel metal on silicon field effect transistor (P-type MOSFET, or PFET) that applies compressive strain on channel 106.

In some embodiments, gate stack 110 includes a liner layer, a gate oxide layer, a work function layer, and a conductive layer sequentially deposited over channel 106. According to some embodiments, the conductive layer in gate stack 110 independently include aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other conductive materials, and/or combinations thereof. In some embodiments, the liner layer is a thermal oxide used to repair an interface of a trench. In some embodiments, the gate oxide layer is silicon dioxide (with a dielectric constant κ=3.9). Some embodiments have a high-k (high dielectric constant, or high κ) dielectric layer (κ>3.9).

Figure 2:
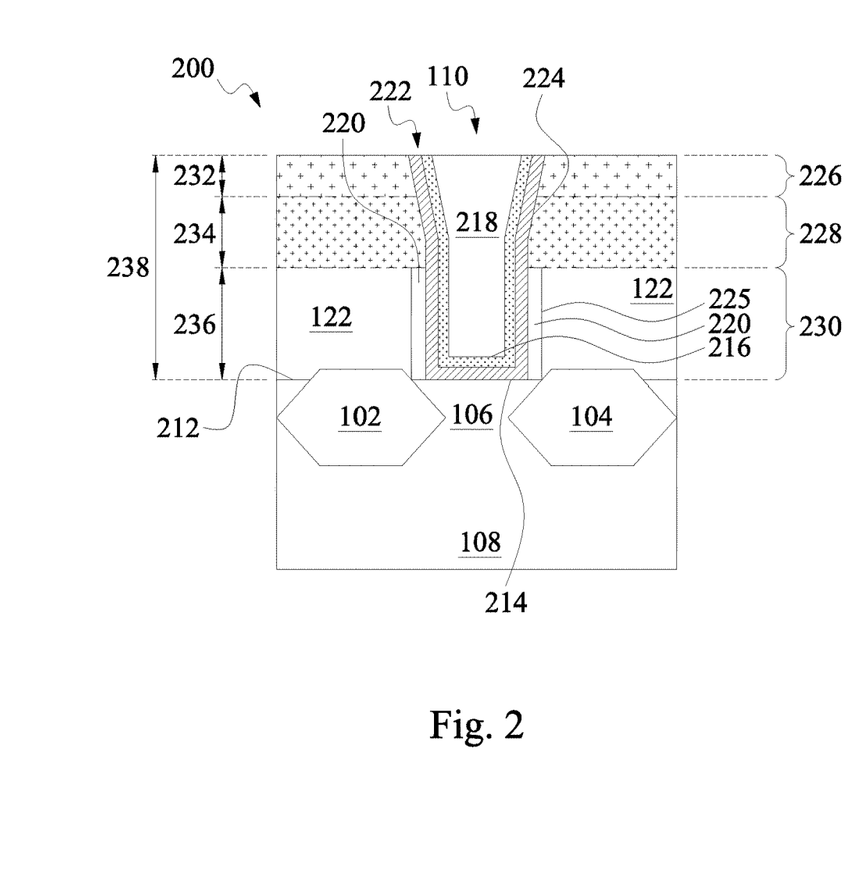
FIG. 2 is a cross-sectional view of some embodiments of a semiconductor device similar to that shown in FIG. 1 along cross-sectional line A-A, having an implanted interlayer dielectric (ILD) adjoining a metal last gate.

FIG. 2 is a cross-sectional view of some embodiments of a semiconductor device 200 similar to semiconductor device 100 in FIG. 1 along cross-sectional line A-A. Source 102, drain 104 and channel 106 are in a fin 108. In some embodiments, the source, drain and channel have been formed in a semiconductor substrate that has been prepared for manufacturing an integrated circuit, rather than being formed in a fin. Some embodiments of the present disclosure include N-type metal on silicon field effect transistors (N-type MOSFET, or NFET) and some embodiments include PFETs. Some embodiments include an integrated circuit having both NFETs and PFETs in a same circuit.

Interlayer dielectric (ILD) 122 is a layer (an ILD layer) of dielectric material (ILD material) on a top surface 212 of fin 108. In some embodiments, ILD 122 is silicon dioxide. In some embodiments, ILD 122 is silicon oxy-nitride, a low-k dielectric material ($\kappa<3.9$), or another suitable dielectric material. In some embodiments, ILD 122 contains silicon, oxygen, and hydrogen (Si—O—H). Gate stack 110, including a gate oxide 214, a work function layer 216, and a gate conductive layer 218, is located over channel 106. In some embodiments, a liner layer (not shown) is located between gate oxide 214 and fin 108. A spacer 220 is located between gate stack 110 and ILD 122. Gate stack 110 is located in a trench 222 within ILD 122. In some embodiments, a sacrificial gate (see, for example, element 404 in FIG. 4) is formed on channel 106 before ILD 122 is deposited over source 102, drain 104, and sacrificial gate 404. In some embodiments of a manufacturing process for a gate-last metal gate semiconductor device, the sacrificial gate is exposed by performing a chemical-mechanical planarization (CMP) process to expose a top side of the sacrificial gate. In some embodiments of gate-last metal gate transistors, the sacrificial gate is removed by, for example, plasma etching or wet chemical etching, forming a trench in which the gate electrode, such as gate electrode 110, is formed. Trench 222 has sidewalls that have an upper sidewall 224 and a lower sidewall 225. Upper sidewall 224 is located around an upper portion of gate stack 110 while lower sidewall 225 extends along gate stack 110. Lower sidewall 225 is substantially perpendicular to a top surface 212 of fin 108. Upper sidewall 224 extends at an angle (a sidewall angle) with respect to lower sidewall 225. In some embodiments of semiconductor device 200, the sidewall angle is more than about 0.5° and less than about 8°. The sidewall angle is relevant to manufacturing processes related to forming the gate electrode in the trench. A sidewall angle below about 0.5°, including negative sidewall angles, is more prone to having manufacturing defects associated with faster deposition buildup at trench corners than on trench sidewalls, in some instances. A sidewall angle greater than about 8° is sometimes associated with dimension control issues when manufacturing a semiconductor device, in some instances. In some embodiments, when an opening of a trench is too large, a distance between features of the semiconductor device is too large and parasitic capacitance between features of the semiconductor device impact operational characteristics of the semiconductor device, in some instances.

ILD 122 is divided into sections according to a doping or implantation process that adjusts an amount of strain in ILD 122 during the gate-last metal gate manufacturing process. Doping ILD 122 with different dopants at different levels of ILD 122 sets an average lattice constant in each level of ILD 122. In some instances, the average lattice constant is called the effective lattice constant. A lattice constant, or a lattice parameter, is a physical dimension of unit cells in a crystal lattice. In materials that have homogenous composition (such as pure silicon dioxide), the lattice constant of the compound is the same for each unit cell in the compound. For materials with heterogeneous composition (such as doped or implanted silicon dioxide), the lattice constant for the bulk material will be an average lattice constant determined from the lattice constant of parts of the doped material that are undoped, and parts of the doped material that contain dopant atoms that alter the lattice constant of cells that contain dopant atoms. When dopant atoms are larger than atoms of a material (as, for example, in the non-limiting example of silicon dioxide doped with germanium), the lattice constant of the heterogeneous (doped) material will increase compared to the lattice constant of the homogenous (undoped) material. When dopant atoms are small, the lattice constant of the doped material decreases after doping.

Configuring the average lattice constant in each level of ILD 122 generates a particular amount of strain applied by ILD 122 (at that level in the ILD) on the materials deposited in trench 222 to form gate stack 110. ILD 122 has a first section 226 adjoining a top surface of ILD 122 and adjoining an upper sidewall 224 of trench 222. ILD 122 has second section 228 below the first section 226, and a third section 230 between second section 228 and top surface 212. First section 226 has a first thickness 232, second section 228 has a second thickness 234, and third section 230 has a third thickness 236. ILD 122 has an ILD thickness 238 that is equal to the sum of first thickness 232, second thickness 234, and third thickness 236. In some embodiments, upper sidewall 224 adjoins only first section 226. In some embodiments, upper sidewall 224 adjoins both first section 226 and second section 228. In some embodiments, upper sidewall 224 adjoins only a portion of second sections 228. In some embodiments, first thickness 232 is smaller than second thickness 234. In some embodiments, second thickness 234 is smaller than first thickness 232. In some embodiments, a ratio of first thickness 232 divided by second thickness 234 is larger than about 0.125 and smaller than about 0.9. If the ratio is too low, then a leakage current will increase, in some instances. If the ratio is too high, then a width of the opening is increased too much and risk of parasitic capacitance/resistance negatively impacting operation of semiconductor device 200 increases due to a reduced distance between gate stack 110 and adjacent elements of the semiconductor device, in some instances.

ILD 122 is made of a dielectric material. First section 226 contains an oxygen-containing dopant at a first concentration. Second section 228 contains a large species dopant (a large species material) at a second concentration. Third section 230 is dielectric material with little or no additional dopants beyond those customary for the dielectric material of ILD 122. Oxygen-containing dopant and large species dopant are added to ILD 122 by at least one doping process. In some embodiments, the doping process is an implanting process, where a dopant, such as an oxygen-containing dopant, is implanted into ILD 122 to form first section 226. In some embodiments, a large species dopant is implanted into ILD 122 to form the second section 228. A large species dopant has a size which is greater than a size of atoms within ILD 122. In some embodiments, implanting a large species dopant into the ILD results in atoms of large species dopant implanted into both first section 226 and second section 228. A power of the implantation process is selected so that third section 230 does not receive dopant from the implantation process. In some embodiments, the oxygen-containing dopant is added to the first section before a large species dopant is added to the second section. In some embodiments, the large species dopant is added to the second section before the oxygen-containing dopant is added to the first section. In some embodiments, oxygen-containing dopant is added to the first section before multiple types of large species dopant are added to the second section in multiple or sequential implanting steps. In some embodiments, multiple types of large species dopants are added to the second section before the oxygen-containing dopant is added to the first section. In some embodiments, the oxygen containing dopant is added to the first section between additions of large species dopant to the second section.

First section 226 has a first lattice constant (a first effective lattice constant), second section 228 has a second lattice constant (a second effective lattice constant), and third section 230 has a third lattice constant, the lattice constant of the dielectric material of the ILD unmodified by added dopants. The third lattice constant is smaller than the second lattice constant.

The second lattice constant is larger than the third lattice constant because of the addition/incorporation of dopant atoms that are larger than atoms of the ILD 122. In some embodiments, incorporation of the atoms of large species dopant (or large species material) into the ILD causes the ILD, at second section 228, to expand toward the center of the trench in the ILD, and puts compressive (lateral) strain on the gate electrode at the level of the second section in the ILD. Examples of large species dopant added to second section 228 (or to first section 226 and second section 228) of the ILD include noble gases such as Ar, Kr, or Xe. Some examples of large species dopant include semiconductor materials such as Si, Ge, P, or As. Other examples of large species dopant include metals such as Sb, Ga, or In. Other large species dopant in these categories and other categories are also able to be incorporated into ILD 122 by a doping process such as implantation. In some embodiments, atoms of large species dopant are added to ILD 122 singly. In some embodiments, a combination of atoms of two or more types of large species dopant are added to ILD 122 in order to induce a lateral strain in ILD 122. Implantation temperatures during an implanting process range from about −180° C. to about +550° C. Implantation at temperatures below about −180° C. is sometimes prone to elevated defectivity in the semiconductor device during implantation because materials become brittle and break rather than deform upon impact of dopant atoms. Annealing an implanted substrate is sometimes indicated in order to heal the structure of the implanted material and reduce pitting, crystalline defects, and promote diffusion of implanted materials through the substrate. Temperatures above about +550° C. are sufficiently elevated that dopant atoms are sometimes prone to diffusion into adjoining structures or penetration too deep into ILD 122 to reliably form a sidewall angle of upper sidewall 224. Lower implantation temperatures are sometimes used when implanting more volatile dopant atoms such as noble gas atoms or to reduce diffusion of implanted materials during the course of the implantation process. After implanting dopant atoms into the second section, dopant atoms make up ranging from 25% to 30% of the atoms in second section. An amount of large species atoms added in an implantation step relates to the size of the large species atoms that are implanted and the ability of the large species atoms to be incorporated into the lattice structure of ILD 122. Larger dopant atoms are added in smaller concentrations than smaller dopant atoms.

The first lattice constant is smaller than the second lattice constant. During implantation of atoms of large species dopants into second section 228, some large species dopants remain in first section 226. Addition of oxygen by implanting oxygen-containing species into first section 226 reduces the amount of hydrogen in first section 226. In some embodiments, addition of oxygen into first section 226 balances the stoichiometry of first section 226 to form chemical bonds between, for example, added atoms of large species dopant and atoms of the ILD layer. By adding oxygen to first section 226, the first lattice constant shrinks as compared to the second lattice constant by balancing the stoichiometry of the first section of ILD 122 to more closely resemble a dielectric material (an oxide, with each semiconductor or other atom in the ILD approaching a balanced level of oxygen bound to that atom). By adding oxygen to the first section of ILD 122 and making the first lattice constant smaller than the second lattice constant, upper sidewall 224 of trench 222 (once the sacrificial gate is removed from within the ILD) pulls or angles away from the center of ILD trench 222. The combination of the expanding ILD at second section 228 and the "shrinking" ILD at first section 226 generates the tilt or offset of upper sidewall 224 of trench 222. According to some embodiments, the amount of oxygen in a first section of ILD 122 is as much as about 30% of the atoms in the first section. In some embodiments, the amount of oxygen in a strained gate-last semiconductor device ranges from about 15% to about 30% of the atoms present in first section 226. Semiconductor devices with less than about 15% composition of doped species do not have sufficient material added to ILD 122 at a level of the ILD 122 to generate strain on the gate electrode. Semiconductor devices with insufficient doped large species do not have large enough lattice constant to physically displace upper sidewall 224 of trench 222 near the second section 228 of ILD 122 to cause the upper sidewall 224 to have a sidewall angle that slopes with a positive angle and reduce filling- and deposition-related device defects during a manufacturing process.

Semiconductor device 200, having compressive strain applied to gate stack 110, experiences a reduction in leakage current as compared to semiconductor devices with similar structure and integration schemes, but lacking dopant addition to the ILD. According to some embodiments, leakage current of semiconductor devices having doped ILDs that apply strain to gate stack 110 ranges from around 95% to around 50% of a leakage current in a semiconductor device built with similar design but without the ILD dopants. According to some embodiments, the amount of leakage current in semiconductor devices with strain-inducing doped ILD is reduced from around 25% to around 40% as compared to similar devices that have an undoped ILD.

Figure 3:
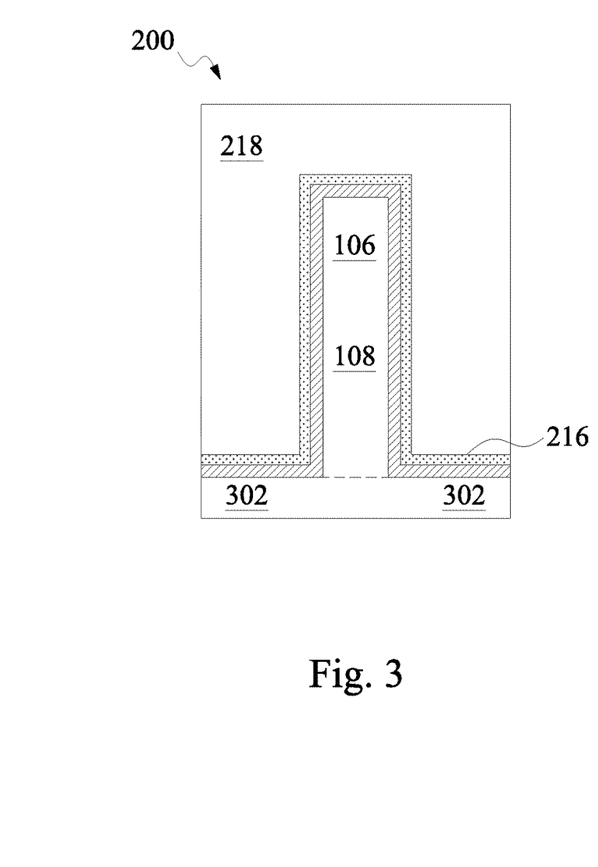
FIG. 3 is a cross sectional view of some embodiments of a semiconductor device similar to that shown in FIG. 1 along cross-sectional line B-B.

FIG. 3 is a cross sectional view of some embodiments of semiconductor device 200 along cross-sectional line B-B as shown in FIG. 1. Channel 106 is in fin 108 extending upward from substrate 302 and covered by a plurality of films, including gate oxide 214, work function layer 216, and gate conductive layer 218 of gate stack 110. In some embodiments, channel 106 and fin 108 are a same material as substrate 302. In some embodiments, channel 106 and fin 108 are a different material than substrate 302. According to some embodiments, the gate oxide 214, work function layer 216, and gate conductive layer 218 cover both sides and a top of channel 106, as well as a portion of substrate 302 below channel 106. In some embodiments, substrate 302 is completely covered by the gate oxide 214, work function layer 216, and gate conductive layer 218. In some embodiments, the gate oxide 214 and work function layer 216 partially cover the substrate and gate conductive layer 218 makes contact with a part of substrate 302 beyond a flat portion of gate oxide 214 and work function layer 216 on the substrate.

In some embodiments, the gate oxide 214 is silicon dioxide. In some embodiments, the gate oxide 214 is a high-κ dielectric material such as hafnium oxide ($HfO_2$) or another high-k dielectric material such as $TiO_2$, HfZrO, $Ta_2O_3$, $HfSiO_4$, $ZrO_2$, $ZrSiO_2$, or combinations thereof. The gate oxide 214 is deposited in some embodiments by atomic layer epitaxy (ALE) or atomic layer deposition (ALD) in order to form a gate oxide layer with a highly uniform film thickness across the channel.

In some embodiments of semiconductor devices, work function layer 216 is located over a gate oxide layer. A work function layer is included in order to adjust a threshold voltage of a transistor, in some instances. According to some embodiments, work function layer 216 is deposited by sputtering or chemical vapor deposition (or variants of chemical vapor deposition) onto gate oxide 214 over channel 106.

In some embodiments, a work function layer or work function metal is deposited on a gate oxide above a channel in order to configure a work function of the FET being manufactured. PFETs and NFETs have, in some embodiments, a same work function metal deposited as part of the gate electrode. In some embodiments, a PFET and an NFET in a same integrated circuit have work function metals deposited as part of the gate electrode in order to adjust the electrical performance of the FETs in the integrated circuit. In some embodiments, a PFET is formed with a P-type work function metal such as TiN, TaN, Ru, Mo, Al, and WN, or a silicide such as $ZrSi_2$, Mo $Si_2$, $TaSi_2$, or $NiSi_2$, or other work function layers, or combinations thereof. In some embodiments, the work function layer of an NFET is an N-type work function modifying metal such as Ti, Ag, Al, TaAl, TaAlC, TaAlN, TaC, TaCN, TaSiN, Mn, Zr, or other N-type work function layer, or combinations thereof. In some embodiments, ALD, evaporation or sputtering is used to form the metal layer. In some embodiments, chemical vapor deposition (CVD) or a variant of CVD such as PECVD (Plasma enhanced chemical vapor deposition), HDPCVD (high density plasma vapor deposition) is used to deposit the work function layer of the gate electrode.

According to some embodiments, a gate conductive layer 218 is a silicon layer deposited over a gate oxide. In some embodiments, the gate conductive layer 218 is a metal, metal silicide, or metal nitride film deposited over a gate oxide. According to some embodiments, a gate conductive layer 218 includes aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other metals, and/or combinations thereof. Gate conductive layer 218 is deposited in some embodiments by a sputtering process or a chemical vapor deposition process. Some variants of metal gate layer deposition include using a HDPCVD, low pressure CVD (LPCVD), or PECVD process to form the gate conductive layer 218.

Figure 4A:
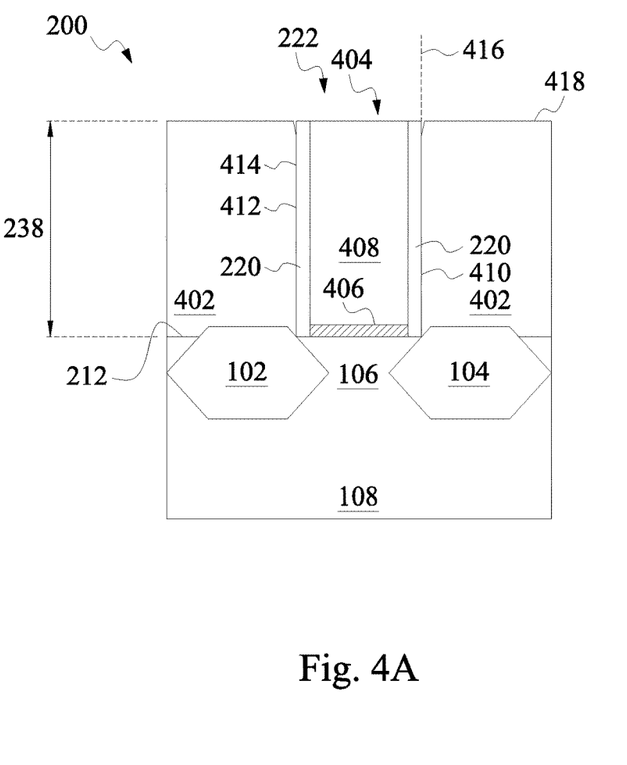
FIGS. 4A-4E are cross-sectional views of some embodiments of a semiconductor device similar to that shown in FIG. 1 along cross-sectional line A-A during a manufacturing process.

FIG. 4A is a cross-sectional view of a semiconductor device 200 along cross-sectional line A-A during a manufacturing process in accordance with some embodiments. Source 102, drain 104, and channel 106 are located in fin 108 of a semiconductor wafer. ILD 402 is an undoped ILD on a top surface 212 of fin 108 and against source 102 and drain 104. ILD 402 contains a trench 222 that is filled with sacrificial gate 404. Sacrificial gate 404 includes sacrificial gate oxide 406 against channel 106 and sacrificial gate material 408 above sacrificial gate oxide 406. In some embodiments, sacrificial gate 404 further includes a hard mask layer (not shown). In some embodiments spacer 220 extends from top surface 212 along an ILD interface 410 between ILD 402 and sacrificial gate 404. In some embodiments, spacer 220 extends along a lower interface portion 412 of ILD interface 410 while at an upper interface portion 414 of ILD interface, ILD 402 makes direct contact with sacrificial gate material 408. A first reference line 416 extends along lower interface portion 412 of ILD interface 410. A top surface 418 of ILD 402 and sacrificial gate 404 has been formed by a chemical mechanical polish (CMP) processing step to expose sacrificial gate 404 and to establish a consistent thickness of ILD 402 (ILD thickness 238) before ILD 402 is implanted and annealed in other operations.

Figure 4B:
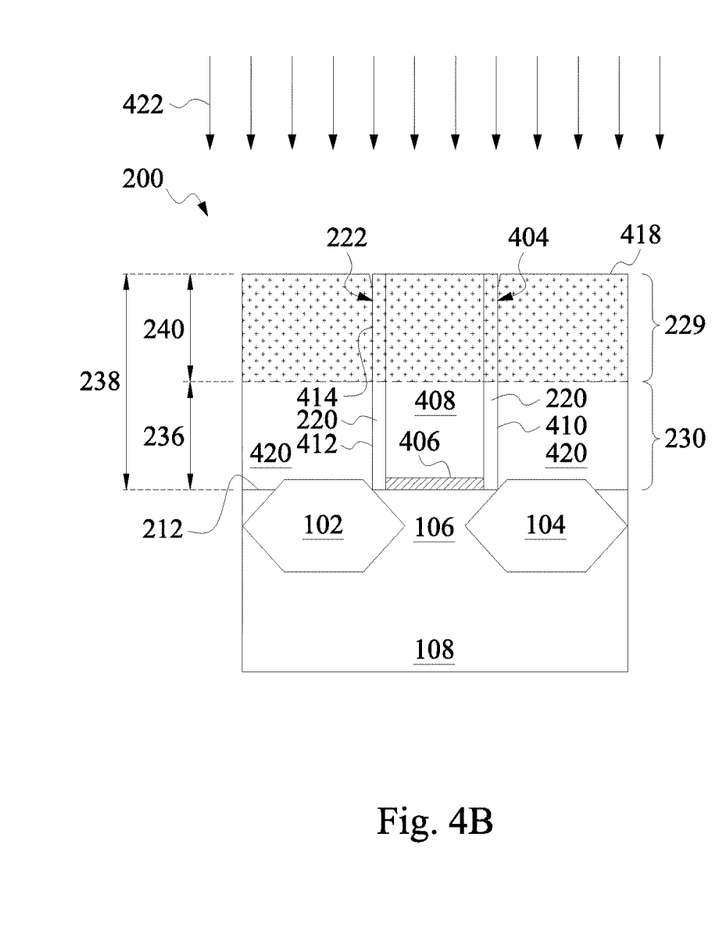

FIG. 4B is a cross-sectional view of a semiconductor device 200 along cross-sectional line A-A during a manufacturing process in accordance with some embodiments. Source 102, drain 104 and channel 106 are located in fin 108 of a semiconductor wafer. An ILD 420 is a doped ILD that receives at least one large species dopant by a doping process such as implanting process 422. Implanting process 422 is a blanket implanting process which introduces the large species dopant into sacrificial gate 404, spacer 220 and ILD 420. ILD 420 is against top surface 212 of fin 108 and against source 102 and drain 104 and sacrificial gate 404. Sacrificial gate 404 fills trench 222 in ILD 420. Sacrificial gate 404 includes sacrificial gate oxide 406 and sacrificial gate material 408. ILD 420 includes an ILD interface 410 having lower interface portion 412 and upper interface portion 414. In some embodiments, spacer 220 is between ILD 420 and sacrificial gate material 408 along ILD interface 410. In some embodiments, sacrificial gate 404 is protected from implanting process 422 by a mask layer that is on top surface 418 (of ILD 420 and sacrificial gate 404), against sacrificial gate 404. In some embodiments, spacer 220 is protected from implanting process 422 by the mask layer.

ILD 420 is implanted with at least one large species dopant to form a fourth section 229 with fourth thickness 240 below top surface 418. Third section 230 with third thickness 236 is between fourth section 229 and top surface 212 of fin 108. The sum of third thickness 236 and fourth thickness 240 equals ILD thickness 238. Third section 230 is an undoped section of ILD 420 with a lattice constant consistent with undoped ILD material used to make ILD 402. Fourth section 229 has a lattice constant that is larger than the lattice constant of third section 230 because of the at least one large species dopant embedded therein. In some embodiments, fourth thickness 240 extends below a top edge of spacer 220. In some embodiments, fourth thickness 240 is above a top edge of a spacer. In some embodiments, large species dopant is distributed evenly through the fourth section. In some embodiments, large species dopant is distributed primarily toward a bottom end of fourth section 229, against the third region. In some embodiments, fourth section 229 is against spacer 220. In some embodiments, fourth section 229 is separated from spacer 220. In some embodiments, only one kind of large species dopant is added to fourth section 229. In some embodiments, multiple kinds of large species dopant are added to fourth section 229 in implanting processes. In some embodiments, the large species dopant includes noble gases such as argon (Ar), krypton (Kr), or xenon (Xe). In some embodiments, large species dopant includes semiconductor materials such as silicon (Si), germanium (Ge), phosphorous (P), or arsenic (As). Some embodiments include of large species dopant include metals such as tin (Sb), gallium (Ga), or indium (In).

Figure 4C:
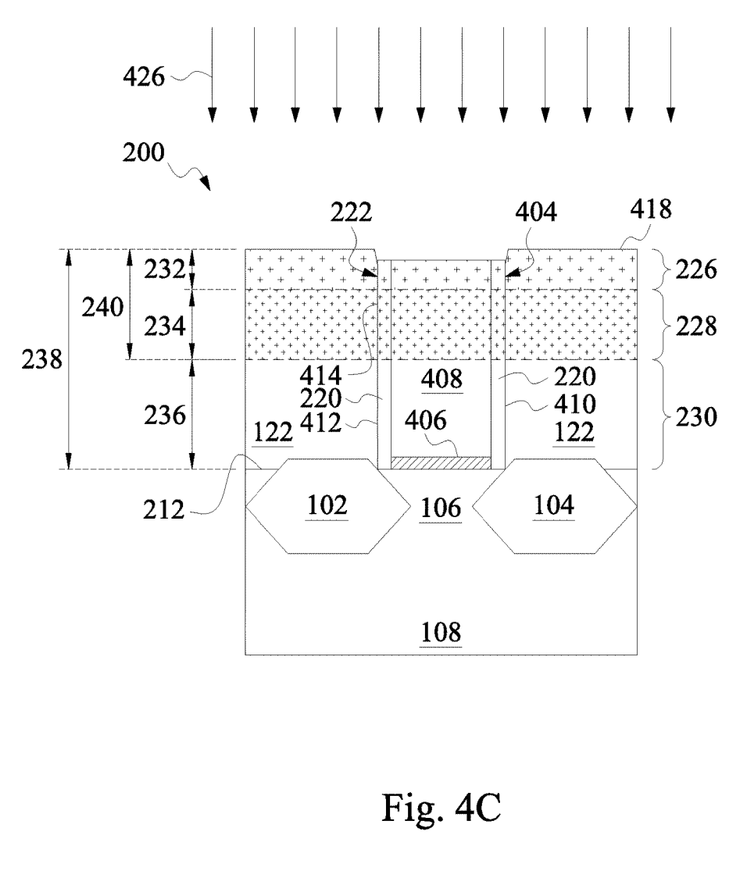

FIG. 4C is a cross-sectional view of a semiconductor device along cross-sectional line A-A during a manufacturing process in accordance with some embodiments. Source 102, drain 104, and channel 106 are located in a fin 108 of a semiconductor wafer. ILD 122 is a doped ILD having at least one large species dopant in second section 228 and an oxygen-containing dopant in first section 226. ILD 420 (best seen in FIG. 4B) receives the oxygen-containing dopant by a doping process such as implanting process 426. Implanting process 426 is a blanket implanting process which introduces the oxygen-containing dopant into sacrificial gate 404, spacer 220 and ILD 420. Third section 230 is an undoped section of ILD 122. ILD 122 is against top surface 212 of fin 108, against source 102 and drain 104. ILD 122 has ILD interface 410 against sacrificial gate 404. ILD interface 410 has lower interface portion 412 and upper interface portion 414. In some embodiments, spacer 220 is between ILD interface 410 and sacrificial gate 404 and against top surface 212. In some embodiments, spacer 220 is against only lower interface portion 412. In some embodiments, spacer 220 is against both lower interface portion 412 and upper interface portion 414. Sacrificial gate 404 includes sacrificial gate oxide 406 and sacrificial gate material 408. Sacrificial gate 404 is located in trench 222 of ILD 122. Trench 222 results from depositing undoped ILD material over sacrificial gate 404 and against top surface 212, followed by planarizing the ILD material to form top surface 418 and expose sacrificial gate 404. Trench 222 is a filled trench that is subsequently emptied and re-filled during a manufacturing process to for a gate electrode such as gate stack 110.

First section 226 has a first thickness 232 and is against top surface 418. Second section 228 has second thickness 234 and is located between first section 226 and third section 230. The sum of first thickness 232 and second thickness 234 is the same as fourth thickness 240. The sum of first thickness 232, second thickness 234, and third thickness 230 is equal to ILD thickness 238. First section 226 contains oxygen-containing dopant added during implanting process 426. Second section 228 contains at least one large species dopant added during implanting process 422. In some embodiments, first section 226 also contains the at least one large species dopant added during implanting process. In some embodiments, implanting process 422 is performed with a single large species dopant before implanting process 426. In some embodiments, implanting process 422 is performed with multiple large species dopants before implanting process 426. In some embodiments, implanting process 426 is performed before adding at least one large species dopant during implanting process 422.

Third section 230 has a third lattice constant that is a lattice constant of an undoped dielectric material used to make ILD 122. Second section 228 has a second lattice constant that is larger than the third lattice constant. First section 226 has a first lattice constant that is smaller than the second lattice constant. The second lattice constant is larger than the third lattice constant because second section 228 incorporates atoms of at least one large species dopant added during an implanting process such as implanting process 422. The first lattice constant is smaller than the second lattice constant because first section 226 contains an oxygen-containing dopant added during an implanting process such as implanting process 426. Adding oxygen-containing dopant to first section 226 shifts a stoichiometric ratio of oxygen and non-oxygen species in ILD 122 to more closely resemble a stoichiometric ratio of elements in a fully-oxygenated (i.e., oxygen-saturated) dielectric material such as ILD material in third section 230, or in ILD 402. The larger lattice constant of second section 228 causes second section 228 to apply lateral pressure (or, compressive strain) against sacrificial gate 404, toward a center of trench 222. First section 226, because it has a smaller lattice constant than second section 228, experiences tensile strain (pulling away from a center of trench 222).

In some embodiments, sacrificial gate 404 is protected during implanting process 426 by a mask layer on top surface 418 and against sacrificial gate 404. According to some embodiments, a same mask layer is used during implanting process 422 and implanting process 426. In some embodiments, the mask layer protects spacer 220. In some embodiments, fourth thickness 240 extends below a top side of spacer 220. In some embodiments, first thickness 232 extends below a top surface of spacer 220. In some embodiments, section 226 is separated from spacer 220 and second section 228 makes direct contact with sacrificial gate material 408. In some embodiments, third section 230 makes direct contact with sacrificial gate material 408.

Figure 4D:
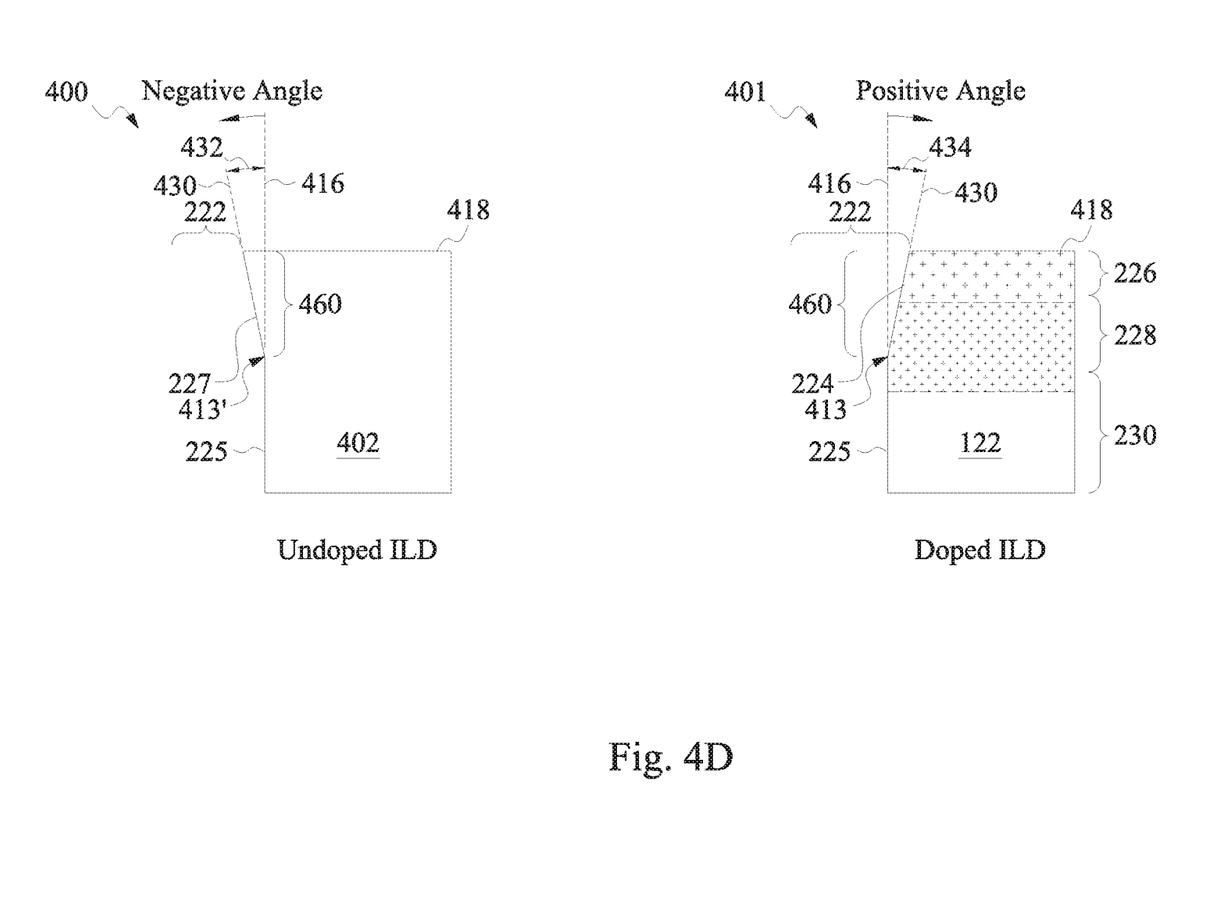

FIG. 4D is a first cross-sectional view 400 and a second cross-sectional view 401, along cross-sectional line A-A as described in FIG. 1, of trenches in separate ILD layers during a manufacturing process after removal of a sacrificial gate, according to some embodiments. FIG. 4D highlights structural differences between an undoped ILD such as ILD 402 and a fully doped ILD such as ILD 122 after sacrificial gate removal.

First cross-sectional view 400 is of an undoped ILD such as ILD 402. First reference line 416 extends along the surface of lower sidewall 225 and second reference line 430 extends along the surface of upper sidewall 227. Upper sidewall 227 is an inward-sloping upper sidewall, angled or tilted toward a center of trench 222. First sidewall angle 432 is the angle between first reference line 416 and second reference line 430. First sidewall angle 432 is a negative angle, indicating that upper sidewall 227 tilts toward a center of trench 222. Top region 460 of ILD 402 is sloped inwardly. Top region 460 is a portion of ILD 402 above a deviation point 413', where first reference line 416 and second reference line 430 deviate from each other. Upper sidewall 227 is above deviation point 413' and lower sidewall 225 is below deviation point 413'.

Second cross-sectional view 401 is of a doped ILD such as ILD 122. Doped ILD 122 has first section 226 against top surface 418, second section 228, against a bottom of first section 226, and third section 230 below second section 228. First section 226 is doped with an oxygen-containing dopant and at least one large species dopant and has a first lattice constant. Second section 228 has at least one large species dopant and has a second lattice constant larger than the first lattice constant. ILD 122 has a lower sidewall 225 and an upper sidewall 224, separated at a deviation point 413. In some embodiments, deviation point 413 is at a same height as deviation point 413'. In some embodiments, deviation point 413 is at a different height from deviation point 413'. First reference line 416 extends along the surface of lower sidewall 225 and second reference line 430 extends along the surface of upper sidewall 430. Second sidewall angle 434 is an angle between first reference line 416 and second reference line 430 from where they intersect at deviation point 413.

Second sidewall angle 434 is a positive sidewall angle. After sacrificial gate 404 is removed from within ILD 122, second section 228 expands in toward a center of trench 222, while first section 226, with a smaller lattice constant than second section 228, pulls away from a center of trench 222. The combination of expansion of second section 228 and receding of first section 226 tilts upper sidewall 224 away from a center of trench 222. Top region 460 of ILD 122 is a portion of ILD 122 above deviation point 413.

A semiconductor device with a doped ILD such as ILD 122 has, in some embodiments, an upper sidewall 224 with sidewall angle 434 that is up to 8° more positive than sidewall angle 430 of an undoped ILD such as ILD 402. In some embodiments of semiconductor devices, upper sidewall 224 is up to 5° more positive than in a semiconductor device with an undoped ILD. Factors relevant to the sidewall angular change of an upper sidewall in a doped-ILD semiconductor device include at least [1] the nature of the large species dopant atom, [2] the amount of large-species dopant atoms added to the ILD, [3] the amount of oxygen added to the first section of the ILD, and [4] the chemical composition of the ILD material before any dopant addition takes place. In some embodiments, other factors can influence the amount of sidewall angular change in a doped-ILD semiconductor device, such as the conditions under which the semiconductor device was annealed.

Embodiments of semiconductor devices having a positive sidewall angle experience easier filling or film deposition into the trench after the sacrificial gate has been removed. Easier filling and film deposition results in embodiments of semiconductor devices that have less pronounced seam features in the metal fill of the gate electrode. Easier filling also results, in some embodiments, in lower overall frequency of void defects caused by "necking" or "pinching off" of the trench during filling/film deposition. Necking and pinch-off failures occur when film growth at the upper edge or corner of a trench is faster than the film growth on the trench sidewall at a lower position on the sidewall. Eventually, the film growth rate differential leads to the top corner portions of the film being grown making contact from opposite sides of the trench while the lower portions of the film being grown remain separated. Upper sidewall portions with a positive sidewall angle compensate for uneven film deposition along the trench sidewall and facilitate complete filling of the trench before closure of the trench at the trench opening.

Figure 4E:
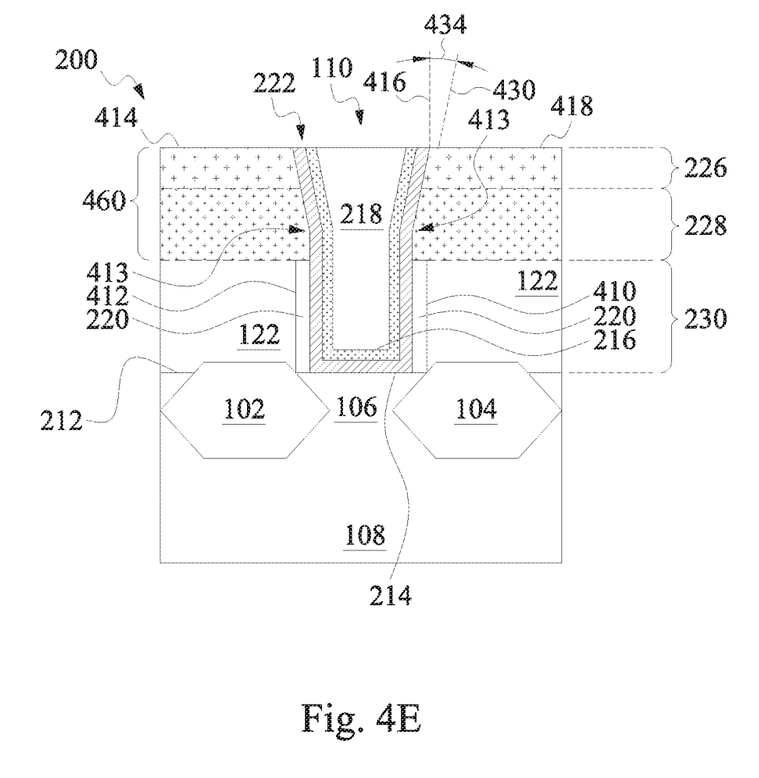

FIG. 4E is a cross-sectional view of a semiconductor device 200 having ILD 122 on top of fin 108 during a manufacturing processing according to some embodiments. ILD 122 is a doped ILD. Fin 108 contains source 102, drain 104, and channel 106. ILD 122 rests on top surface 212 of fin 108, against source 102 and drain 104. Gate stack 110 is above channel 106 in trench 222. Gate stack 110 includes spacer 220 on each side of trench 222, gate oxide layer 214, work function layer 216, and gate conductive layer 218. ILD 122 has three sections: first section 226, second section 228, and third section 230. First section 226 is at a top of ILD 122 against surface 418. Third section 230 is at a bottom of ILD 122 against top surface 212 and over source 102 and drain 104. Second section 228 is between first section 226 and third section 230. First section 226 contains an oxygen-containing dopant and a large species dopant. Second section 228 contains atoms of the large species dopant.

Trench 222 has ILD interface 410 with lower interface portion 412 and upper interface portion 414. Upper interface portion 414 corresponds to top region 460 of ILD 122 having a positive angle 434 between first reference line 416 and second reference line 430. ILD interface 410 has lower interface portion 412 below deviation point 413 and upper interface portion 414 above deviation point 413. In some embodiments, spacer 220 isolates gate stack 110 from lower interface portion 412. In some embodiments, spacer 220 is below deviation point 413 and gate stack 110 makes direct contact with lower interface portion 412. Gate stack 110 includes, in some embodiments, gate electrode 214, work function layer 216, and gate conductive layer 218. In some embodiments, gate stack 110 also includes a liner layer and other layers to enhance performance of the gate.

Figure 5:
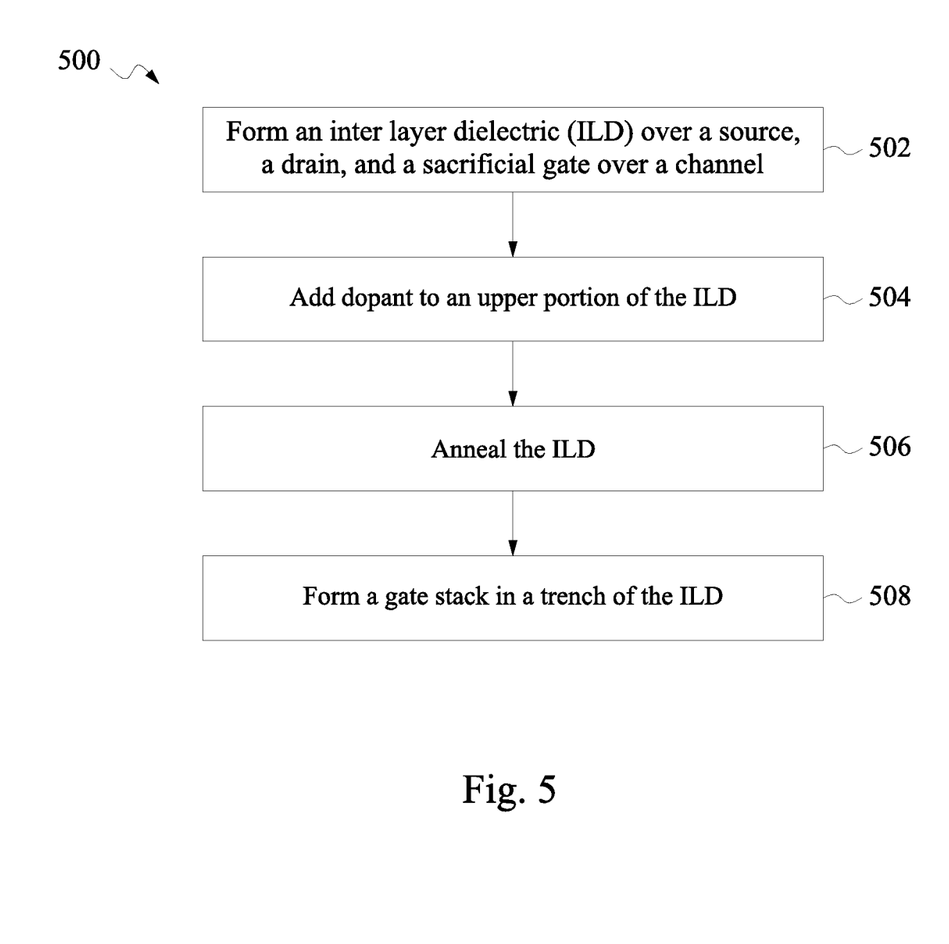
FIG. 5 is a flow diagram describing some embodiments of a method of making a semiconductor device.

FIG. 5 is a flow diagram of a method 500 of making a semiconductor device in accordance with some embodiments. In operation 502, an interlayer dielectric (ILD) is formed or deposited on a source, a drain, and a sacrificial gate (such as element 404, FIG. 4E) over a channel of a field effect transistor (FET). In some embodiments, the ILD is silicon dioxide, silicon oxy-nitride, or a low-k dielectric material. According to some embodiments, the ILD is deposited by a CVD process across the source and the drain of a FET and over a sacrificial gate located over the FET channel. In some embodiments, a planarization or etching process follows the deposition process in order to flatten a top surface of the ILD. In some embodiments, planarization or etching of the ILD precedes a doping process, such as is described by operation 504, in order to preserve dopant characteristics of the ILD in different sections of the ILD. Preserving dopant characteristics of the ILD at different sections of the ILD generates a positive sidewall angle at the upper portion of the trench sidewall. Upper portions of ILD with positive angles are less prone to manufacturing defects and fill more easily than upper portions of ILD with negative angles. In some embodiments, the ILD is planarized in order to expose a top surface (see, for example, element 418 of FIG. 4A) of the ILD. A trench in the ILD is formed by depositing ILD material over the sacrificial gate and planarizing the ILD material to expose the sacrificial gate. When the sacrificial gate is over the channel and within the ILD, the trench is a filled trench. The trench is emptied or opened by removing, such as by a wet chemical etch process, the materials of the sacrificial gate from within the ILD while leaving the ILD behind. Trench sidewalls are exposed when the sacrificial gate is removed from within the ILD. The trench is filled by depositing layers of material on the ILD and the channel to form a gate stack such as gate stack 110. In some embodiments, the gate stack includes a liner layer, a gate oxide layer, a work function layer, and a gate conductive layer.

In operation 504, an upper portion of the ILD is doped. Doping an ILD includes implanting a dopant into the ILD to different depths according to the desired strain characteristics on the gate electrode and the upper sidewall profile of the trench in which the gate electrode is formed. According to some embodiments, after the ILD has been deposited, sections of ILD are designated for different treatment in implantation steps that dope the ILD with various dopants. Sections of the ILD are designated according to the desired strain and profile characteristics for the FET. A first section, having a first thickness, is located adjacent to a top surface of the ILD. A second section, having a second thickness is located below a first section and above a third section. The third section has a third thickness. The third section is against a source and a drain. An ILD thickness is equal to the sum of first thickness, second thickness, and third thickness. The first thickness and second thickness, combined, are less than 50% of the ILD thickness. In some embodiments, first thickness and second thickness are less than 25% of the ILD thickness. If the first and second thicknesses extend too far into the ILD, then a width of the opening for replacing the sacrificial gate increases to a point of increasing the risk of parasitic capacitance/resistance negatively impacting operation of the semiconductor device due to a proximity between the replacement gate and other components of the semiconductor device, in some instances. The first thickness and second thickness are designated to form an angled or tilted upper sidewall (see element 224, FIG. 2) of the trench after the sacrificial gate is removed from the ILD. A semiconductor device with a positive sidewall angle at an upper portion of the ILD will have improved film deposition and trench-filling characteristics.

The first section is implanted with a first dopant. The first dopant is a lattice-constant reducing compound. In some embodiments, the first dopant is an oxygen-containing dopant. In some embodiments, other lattice-constant reducing compounds are also used to dope the first section of the ILD. According to some embodiments, the oxygen-containing dopant includes molecular oxygen, ozone, or atomic oxygen. In some embodiments, the oxygen-containing dopant contains oxygen and a different type of atom. In some embodiments, the oxygen-containing dopant is implanted into the first section of the ILD down to a depth equal to the first thickness.

Some ILDs contain hydrogen that remains from an ILD formation process. The amount of remaining hydrogen in an ILD correlates with the susceptibility of the film to etching by hydrogen fluoride (HF) in wet clean processes. Hydrogen in ILD is sometimes associated with uneven material removal during wet clean processing and wet etching steps. Decreasing the amount of hydrogen in an ILD, such as by implanting oxygen into the ILD, stabilizes the ILD structurally. Stabilized ILD is more homogeneous and etches at a more uniform rate than unstabilized, heterogeneous ILD. Uniform material removal during wet clean processing preserves critical dimensions of features in a semiconductor device. ILD stabilization occurs by, for example, reducing the concentration of hydrogen in the ILD. Hydrogen is removed in some embodiments by promoting formation of $H_2O$ by the implanted oxygen and in-situ hydrogen. In some embodiments, the first dopant is implanted with implantation energies ranging from around 1 k electron volt (eV) to around 80 keV. Energies below 1 keV do not drive implanted atoms into the ILD with sufficient energy to modify lattice constants of the ILD deep enough to alter upper sidewall 224 sidewall angle 412 in a positive direction. Implantation energies greater than 80 keV do structural damage to the ILD that is not repaired by anneal conditions that preserve doping profiles and distributions in the source, the drain, and the channel.

Some embodiments of the operation implant oxygen to an implant dosage ranging from $1 \times 10^{13}$ to $1 \times 10^{17}$ atoms/cm$^2$ in the ILD. Oxygen implant dosages less than around $1 \times 10^{13}$ atoms/cm$^2$ in the first section of the ILD are less likely to generate sufficient lateral strain away from a center of the trench in order to generate a positive sidewall angle. Oxygen implant dosages greater than around $1 \times 10^{17}$ atoms/cm$^2$ in the first section of the ILD have a greater likelihood of modifying strain on the gate stack to adversely impact semiconductor performance. In some embodiments, oxygen implant dosages greater than around $1 \times 10^{17}$ atoms/cm$^2$ in the first section of the ILD adversely impact dimensions of the gate stack and introduce issues related to parasitic capacitance in features adjoining the gate stack.

In some embodiments of the method, an implantation temperature ranges from 0° C. to 500° C. Implantation temperatures below 0° C. are sometimes associated with greater brittleness of the materials being implanted, leading to elevated levels of material damage that are repaired with prolonged anneal times or increased anneal temperatures. Implantation temperatures below 0° C. are sometimes recommended for dopants with greater volatility such as noble gasses Ar, Kr, and Xe. Implantation temperatures above 500° C. are sometimes associated with greater dopant mobility during and after implantation than in semiconductor devices with lower implantation temperatures. Implantation temperatures above 500° C. are sometimes more prone to implantation at greater depths than for implantation temperatures below 500° C., causing an adjustment in the implantation energy to be made.

The second section of the ILD is also implanted with a large species dopant. In some embodiments, the large species dopant is a noble gas such as Ar, Kr, and Xe. In some embodiments, noble gas dopants are implanted at implantation energies ranging from 1.0 keV to 40 keV. Implanting a noble gas dopant converts a film stress form a tensile stress to a compressive stress that expands the dielectric material toward a center of the opening adjoining the dielectric material. In some embodiments, the large species dopant is one or more large diameter atom such as atoms of semiconductor materials including Ge, P, and As. In some embodiments, silicon (Si) is also implanted with large diameter atoms such as Ge, P, and As. Implantation energy for large atoms of semiconductor materials such as In, Ge, P, and As is frequently from 3.0 keV to 40 keV. In some embodiments, implantation of large semiconductor material atoms is followed by oxygen implantation to a same depth or a lesser depth, and followed by a flash anneal to form semiconductor oxides such as $Ga_xO_y$, $P_xO_y$, and $As_xO_y$. Some embodiments include metals such as Sb, Ga, and In. The examples of large species dopants described herein are exemplary and are not intended to be limiting on the scope of subject matter of the present application. In some embodiments, the large species dopant is implanted up to a second concentration ranging from about 25% to about 30% in the second section of the ILD. Some embodiments include implantation schemes that involve a second oxygen-containing species implantation to promote formation of oxide compounds such as $Sb_xO_y$, $Ga_xO_y$, and $In_xO_y$.

In some embodiments, an implantation temperature is in a range from about −180° C. to about +550° C. Lower implantation temperatures are sometimes preferred when implanting more volatile large species dopants such as noble gas atoms. Higher implantation temperatures are sometimes preferable for implanting heavier atoms such as semiconductor material atoms (including Si, Ge, P, and As) and metal atoms (including Sb, Ga, and In). In some embodiments, the large species dopant is added in a first implantation step. In some embodiments, an oxygen-containing compound is used for the first implantation process. In some embodiments, multiple large species are implanted sequentially. In some embodiments, the oxygen-containing species is implanted between large species implanting steps. In some embodiments, oxygen-containing species implantation is a last implanting step, following implanting of one or more large species implanting processes.

In operation 506, the ILD is annealed. Annealing the ILD heals damage to the ILD that occurred during the implanting steps where the oxygen-containing dopant and large species dopants and second dopants are added to the ILD. By annealing, bonds between atoms of the ILD are re-formed and dopant atoms are incorporated into the ILD crystal structure. When dopant atoms are incorporated into the ILD, the lattice constant of the ILD is modified to increase or decrease with respect to undoped portions of the ILD. In doped sections of the ILD, such as first section 226 and second section 228 (FIG. 2), the average lattice constant is altered and the ILD is strained with respect to undoped sections of the ILD, such as third section 230.

In some embodiments of operation 506, annealing the ILD is performed using a laser anneal process. Some embodiments of a laser anneal use a laser pulse with a light wavelength ranging from about 540 to about 810 nanometers (nm). Some version of the operation 506 use a laser pulse power ranging from 1.4 to 2.2 kW. Some embodiments of operation 506 are performed in a mixture including nitrogen and oxygen at a pressure ranging from around 700 to around 780 torr. In some embodiments of the method, the semiconductor device is preheated to a pre-heat temperature ranging from about 250° C. to about 500° C. Pre-heating the semiconductor device allows anneal conditions to be less harsh than for un-heated semiconductor devices. In some embodiments, pre-heating allows a manufacturing process to use smaller laser power (for laser anneals) or shorter laser pulses or thermal shock conditions to heal defects in ILD 122 without affecting doping characteristics of the channel.

In some embodiments, operation 506 is a flash anneal process. In some embodiments, the flash anneal heats the semiconductor device to a peak anneal temperature ranging from 1000° C. to 1200° C. In some embodiments, the flash anneal process is in a range from 1 to 20 milliseconds (ms). In some embodiments, the semiconductor device is pre-heated to a temperature ranging from around 700° C. to around 850° C. before the flash anneal occurs. In some embodiments, the flash anneal occurs in a nitrogen/oxygen atmosphere ranging from 700 to around 800 torr.

In some embodiments, a thickness of implanted dopant around an average implantation depth of the dopant atoms, after annealing, is from around 1.0 to around 50 nm, according to the implantation energy, the implanted species, and the characteristics of thermal diffusion of dopant through a particular substrate for a given temperature profile during implantation. Narrower bands of implanted atoms in some embodiments are able to produce smaller bands of stressed dielectric material. In some embodiments, a larger band of stressed dielectric material is generated by a broad band of implanted atoms in the dielectric material in order to modify a slope of the upper sidewall of the gate opening.

The method includes an operation 508, in which a gate stack is formed in a trench in the ILD. Before forming the gate stack, and after the implant anneal, the sacrificial gate is removed from within the ILD to form a trench. In some embodiments, a sacrificial gate, such as sacrificial gate 404 in FIG. 4A, is made of a sacrificial gate oxide and sacrificial gate material. In some embodiments, sacrificial gate material is a semiconductor material such as polysilicon or silicon germanium. A sacrificial gate is removed, in some embodiments, by sequential wet chemical etching steps to selectively remove the sacrificial gate material and the sacrificial gate oxide while removing as little of the ILD as possible. Removing the sacrificial gate forms the trench in the ILD.

Operation 508 includes a film formation step where a new gate oxide layer is formed on the channel. In some embodiments, the gate oxide is a layer of silicon dioxide. In some embodiments, the gate oxide is a high-κ gate oxide such as $HfO_2$, $HfZrO$, $Ta_2O_3$, $HfSiO_4$, $TiO_2$, $ZrO_2$, $ZrSiO_2$, or another high-κ dielectric material. In some embodiments, the gate oxide is deposited by means of an ALD or thermal oxidation process, or by CVD. In some embodiments, the gate oxide is deposited on the channel and an entirety of the trench sidewall (where the trench sidewall is entirely ILD material). In some embodiments, a lower portion of the trench sidewall is a spacer (see, e.g., spacer 220 in FIG. 4E) and an upper sidewall portion (see element 224, FIG. 2) is ILD material. In some embodiments, the sacrificial gate oxide remains and the gate stack is formed to include the sacrificial gate oxide.

Some embodiments of operation 508 include depositing a work function layer, such as work function layer 216 in FIG. 3, onto the gate oxide in the trench. In some embodiments, the work function layer is a tungsten or metal layer configured to adjust the threshold voltage of the transistor. The work function layer is conductive material based on a conductivity type of the transistor. Some embodiments include depositing a metal carbide work function layer such as SiC or TiC.

Operation 508 includes a conductive gate formation step where a gate conductive layer, such as gate conductive layer 218 in FIG. 2, is formed over the gate oxide in the trench. According to some variants, the gate conductive layer is made of one or more of the following: tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, W, WnN, and alloys thereof, or other metals.

During each of the film formation steps where gate oxide, liner layer, and conductive gate layers are formed in the trench, film materials are also deposited on a top surface of the ILD. After the conductive gate layer is formed in the trench to fill the trench, the portions of the gate oxide, work function layer, and conductive gate layers, and any other layers deposited into the trench, are removed from a top surface of the semiconductor device in order to isolate gate electrodes from each other. Removing the films on the top surface of the semiconductor device is sometimes accomplished by a CMP process that exposes the top surface of the ILD while retaining a portion of the films within the trench to form isolated gate stacks.

Aspects of the present disclosure relate to a method of making a semiconductor device. The method includes doping a first portion of an interlayer dielectric (ILD) with an oxygen-containing material, wherein the ILD is over a substrate. The method further includes doping a second portion of the ILD with a large species material. The second portion includes an area of the ILD below the first portion, and the second portion is separated from the substrate. The method further includes annealing the ILD.

Some aspects of the present disclosure relate to a semiconductor device. The semiconductor device includes a gate stack over a substrate. The semiconductor device further includes an interlayer dielectric (ILD) at least partially enclosing the gate stack. The ILD includes a first portion doped with an oxygen-containing material. The ILD further includes a second portion doped with a large species material. The ILD further includes a third portion being undoped by the oxygen-containing material and the large species material.

Some aspects of the present disclosure relate to a semiconductor device. The semiconductor device includes a gate stack over a fin material. The semiconductor device further includes an interlayer dielectric (ILD) over the fin material and at least partially enclosing the gate stack. The ILD includes a first portion adjacent to a top surface of the ILD, the first portion being doped with an oxygen-containing species and a large species material. The ILD further includes a second portion, wherein the second portion is doped with the large species material.

While the disclosure has been described by way of example and in terms of the above embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of making a semiconductor device, the method comprising:
   doping a first portion of an interlayer dielectric (ILD) with an oxygen-containing material, wherein the ILD is over a substrate;
   doping a second portion of the ILD with a large species material, wherein the second portion includes an area of the ILD below the first portion, and the second portion is separated from the substrate; and
   annealing the ILD.

2. The method of claim 1, wherein doping the first portion of the ILD with the oxygen-containing material comprises doping the first portion of the ILD with atomic oxygen.

3. The method of claim 1, wherein doping the second portion of the ILD with the large species material comprises doping the second portion of the ILD with a noble gas or a semiconductor material.

4. The method of claim 1, wherein doping the second portion of the ILD with the large species material comprises doping a first region of the second portion of the ILD with a first concentration of the large species material, and doping a second region of the second portion of the ILD with a second concentration of the large species material.

5. The method of claim 4, wherein doping the first portion of the ILD comprises doping the first portion of the ILD prior to doping the second region of the second portion of the ILD.

6. The method of claim 1, wherein, after annealing the ILD, the first portion has a first lattice constant and the second portion has a second lattice constant, and the second lattice constant is larger than the first lattice constant.

7. The method of claim 1, wherein the second portion has a first lattice constant and an undoped portion of the ILD has a second lattice constant, and the first lattice constant being larger than the second lattice constant.

8. The method of claim 1, wherein doping the second portion of the ILD comprises doping the ILD to a depth less than about 50% of a total thickness of the ILD.

9. The method of claim 1, wherein doing the second portion of the ILD comprises doping the second portion of the ILD prior to doping the first portion of the ILD with the oxygen-containing material.

10. The method of claim 1, wherein doping the second portion of the ILD comprises doping the second portion of the ILD with a semiconductor material selected from the group consisting of silicon, germanium, phosphorous, and arsenic.

11. The method of claim 1, wherein doping the second portion of the ILD comprises doping the second portion of the ILD with a noble gas selected from the group consisting of argon, krypton, and xenon.

12. A method of making a semiconductor device, the method comprising:
   depositing an interlayer dielectric (ILD) over a sacrificial gate structure;
   planarizing the ILD to expose the sacrificial gate structure;
   doping a first portion of the ILD with a lattice-constant reducing compound, wherein the first portion of the ILD has a first thickness measured perpendicular to a top surface of the ILD;
   doping a second portion of the ILD with a large species material, wherein the second portion is closer to a substrate than the first portion, the second portion of the ILD has a second thickness, and the second portion is separated from the substrate; and
   removing the sacrificial gate structure to form an opening in the ILD.

13. The method of claim 12, wherein the planarizing of the ILD occurs prior to the doping of the first portion of the ILD.

14. The method of claim 12, wherein the doping of the second portion of the ILD comprises doping the second portion of the ILD to have the second thickness where a combination of the first thickness and the second thickness is less than 50% of a total thickness of the ILD.

15. The method of claim 12, further comprising annealing the semiconductor structure, wherein the annealing of the semiconductor structure changes an angle of a portion of a sidewall of the opening in the ILD.

16. The method of claim 15, filling the opening having the changed angle of the portion of the sidewall with a gate stack.

17. The method of claim 12, wherein the doping of the second portion of the ILD occurs prior to the doping of the first portion of the ILD.

18. A method of making a semiconductor device, the method comprising:
   depositing an interlayer dielectric (ILD) over a sacrificial gate structure;
   doping a first portion of the ILD with a first material, wherein the first portion of the ILD has a first thickness measured perpendicular to a top surface of the ILD;
   doping a second portion of the ILD with a second material different from the first material, wherein the second portion is closer to a substrate than the first portion, the second portion of the ILD has a second thickness, and the second portion is separated from the substrate;
   removing the sacrificial gate structure to form an opening in the ILD;
   changing an angle of a portion of a sidewall of the opening in the ILD to have a positive angle; and
   filling the opening having the positive angle with a gate stack.

19. The method of claim 18, wherein the changing of the angle of the portion of the sidewall comprises maintaining an angle of the sidewall of the opening adjacent to the substrate.

20. The method of claim 18, wherein the changing of the angle of the portion of the sidewall comprises forming the positive angle greater than 90-degrees and equal to or less than 98-degrees relative to a top surface of the substrate.

* * * * *